United States Patent [19]

Sakakibara et al.

[11] Patent Number: 4,984,011
[45] Date of Patent: Jan. 8, 1991

[54] IMAGE RECORDING APPARATUS

[75] Inventors: Kenji Sakakibara, Ichinomiya; Michitoshi Akao, Nagoya; Tokunori Katoh, Ichinomiya; Yukichi Sawaki, Gifu, all of Japan

[73] Assignee: Brother Kogyo Kabushiki Kaisha, Aichi, Japan

[21] Appl. No.: 359,690

[22] Filed: May 31, 1989

[30] Foreign Application Priority Data

Jun. 3, 1988 [JP] Japan .................. 63-138071

[51] Int. Cl.$^5$ ............................................ G03B 27/32
[52] U.S. Cl. ..................................................... 355/27
[58] Field of Search .................. 355/30, 69, 285, 204, 355/208, 233, 234, 27, 28; 219/216

[56] References Cited

U.S. PATENT DOCUMENTS 4,853,743 8/1989 Nagumo et al. ............... 355/30

Primary Examiner—L. T. Hix
Assistant Examiner—Khanh Dang
Attorney, Agent, or Firm—Oliff & Berridge

[57] ABSTRACT

An image recording apparatus for recording an image corresponding to an original on a recording medium including a photosensitive recording medium and an image forming sheet. The apparatus comprises a light source for irradiating the original, scanning device for moving the light source and the original relatively to each other during exposure, moving device for moving the photosensitive recording medium during exposure, transferring device for transferring an image on the photosensitive recording medium to the image forming sheet, thermal fixing device for fixing the transferred image on the image forming sheet, temperature detecting device for detecting temperature of the thermal fixing device, first control device for controlling the quantity of current to be supplied to the light source, and second control device for controlling speeds of the scanning device and the moving device. The quantity of current to be supplied to the light source is controlled in accordance with the quantity of current to be supplied to the thermal fixing device by the first control device, and the speeds of the scanning device and the moving device are controlled by the second control device in accordance with the quantity of light of the light source controlled by the first control device.

5 Claims, 3 Drawing Sheets

IMAGE RECORDING APPARATUS

BACKGROUND OF THE INVENTION

The present invention relates to an image recording apparatus, and more particularly to an image recording apparatus for controlling a quantity of current supplied to both a thermal fixing unit and a light source for irradiating an original.

In general, image recording apparatus of this type comprises a light source for irradiating an original, an exposing unit for exposing a photosensitive recording medium to light, a transferring unit for transferring the image on the photosensitive recording medium to an image forming sheet, and a thermal fixing unit for thermally fixing the transferred image on the image forming sheet.

Conventionally, in the image recording apparatus of this type, the heater in the thermal fixing unit and the light source are controlled independently of each other. When the temperature of the heater in the thermal fixing unit drops below a predetermined temperature, the current is supplied to the heater in the thermal fixing unit in order to keep the heater at fixed temperature even during lighting of the light source. On the other hand, even if the current is being supplied to the heater in the thermal fixing unit, exposure may be carried out and the light source is lit. However, in the recording apparatus in which employed is a so-called transfer type photosensitive recording medium as described in U.S. Pat. No. 4,399,209 and Japanese Pat. application Kokai No. 58-88739, a large quantity of light is required to irradiate the original because the photosensitive recording medium is poor in photosensitivity. Therefore, it is obliged to employ the light source which consumes a large amount of electric power. Further, the heat source which consumes a large amount of electric power is also required in the thermal fixing unit. In case of supplying the current to both the light source and the heat source simultaneously, the total consumed current which is the sum of the currents supplied to the light source and the heat source exceeds a predetermined quantity, for example, 15 amperes, a household plug socket thus cannot be used.

SUMMARY OF THE INVENTION

The present invention has been made in view of the foregoing disadvantages, and accordingly, it is an object of the present invention to provide an image recording apparatus in which the total consumed current is limited to a small current and the household plug socket can be used.

In order to achieve the foregoing object, according to the present invention, there is provided an image recording apparatus for recording an image corresponding to an original on a recording medium, the recording medium including a photosensitive recording medium and an image forming sheet, the apparatus comprising; a light source for irradiating the light on the original; optical means for directing the reflected light reflected from the original or the transmitted light passing through the original to the photosensitive recording medium; scanning means for moving the light source and the original relatively to each other during exposure; moving means for moving the photosensitive recording medium during exposure; transferring means for transferring an image on the photosensitive recording medium to the image forming sheet; thermal fixing means for fixing the transferred image on the image forming sheet; temperature detecting means for detecting temperature of the thermal fixing means; first control means for controlling the quantity of current to be supplied to the light source in accordance with the quantity of current to be supplied to the thermal fixing means; and, second control means for controlling speeds of the scanning means and moving means in accordance with the quantity of light of the light source controlled by the first control means.

The above and other object, features and advantages of the present invention will become more apparent from the following description when taken in conjunction with the accompanying drawings in which preferred embodiment of the present invention is shown by way of illustrative example.

DETAILED DESCRIPTION OF THE PREFERRED EMBODIMENT

An embodiment of this invention will be described below with reference to FIGS. 1 thru 3.

Figure 1:
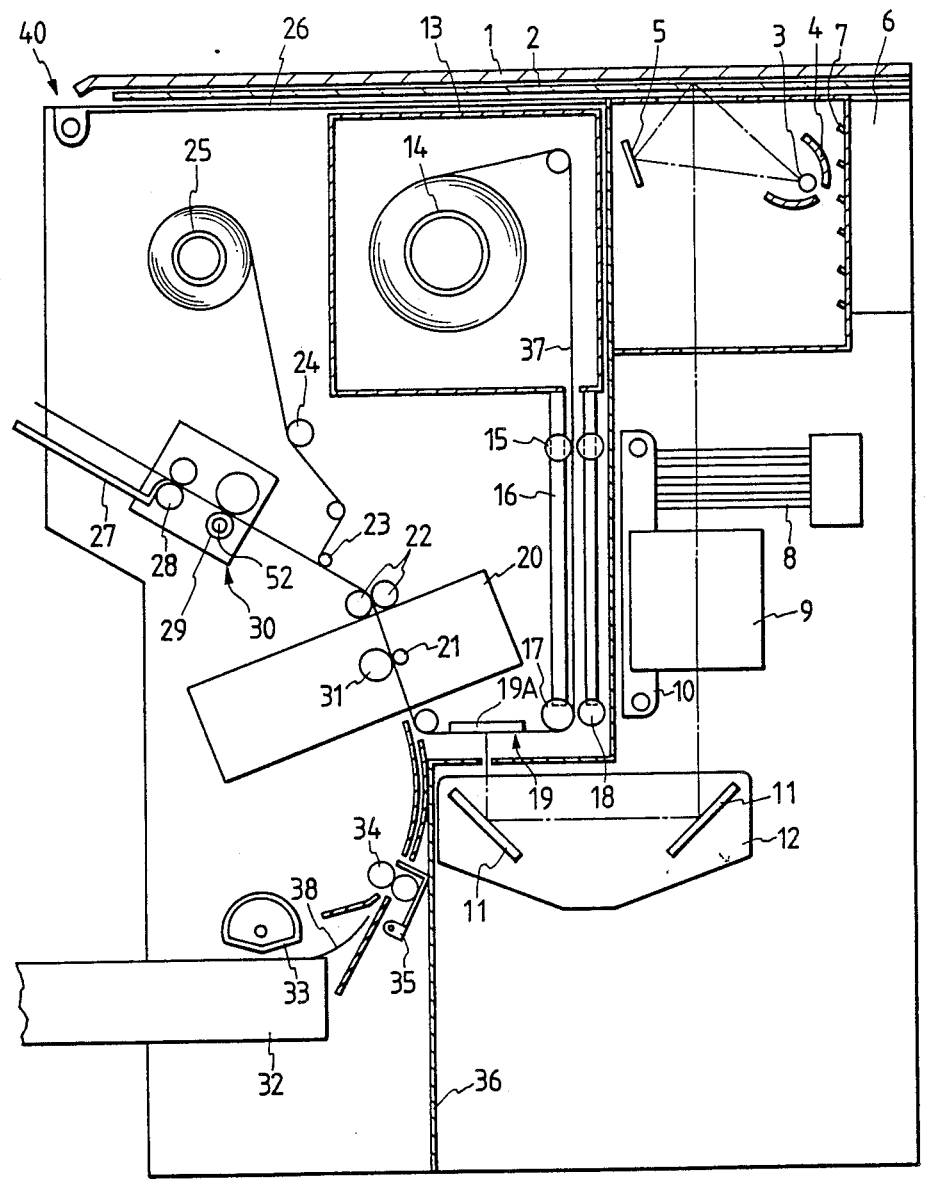
FIG. 1. is a schematic elevational view showing an image recording apparatus according to the present invention.

FIG. 1 shows a copying machine capable of performing a full-color copying. This copying machine employs the transfer type image recording mediums (which comprises a microcapsule sheet and a developer sheet) as described in U.S. Pat. No. 4,399,209 and Japanese Pat. application Kokai No. 58-88739.

First, an optical system and optical path in the copying machine 40 will be described. As shown in FIG. 1, the copying machine 40 has its top plate portion provided with a stand cover 1 and the original support stand glass 2. The original support stand glass 2 is formed of light transmissive material and is movable in the horizontal direction and on which a desired original (not shown) is to be placed. At the upper one side section (right side in FIG. 2) of the copying machine 40, there is fixedly provided light source including a linear halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 can be sequentially irradiated on the entire surface over the region from the one to another ends of the original support stand glass 2 in accordance with the horizontal movement of the glass 2. The light from the light source passes through the transparent original support stand glass 2 and is reflected at the original mounted thereon. The original support stand cover 1 which covers the top surface of the glass 2 is provided in order to prevent this light from leakage out of the apparatus.

To irradiate the light from the halogen lamp 3 on the original at a high efficiency, a flat reflector 5 is disposed on one side of the light source. The flat reflector 5 is adapted to reflectingly direct lights which do not directly direct toward the original from the light source and concentrate such reflected light onto the original.

At another side of the halogen lamp 3 there are provided a fan 6 and a louver 7 for introducing an external air into the apparatus. Accordingly air is effectively impinged onto the light source and the glass 2 to cool them.

A filter 8 is disposed below the original support stand glass 2. Further, a lens unit 9 is provided below the filter 8. Light emitted from the halogen lamp 3 and reflected at the original placed on the original support stand glass 2 passes through the filter 8 and enters the lens 9. The filter 8 alters the light transmissive characteristic in accordance with the sensitivity characteristics of a microcapsule sheet 37, to thereby adjust the color tone of a copied output image. The lens 9 is fixedly secured to a lens mounting plate 10, and fine angular adjustment of this lens with respect to a light path is achievable.

A pair of reflection mirrors 11 and 11 are provided below the lens 9. The condensed lights passing through the lens 9 change their direction by 180 degrees (completely reverse direction) by the two reflection mirrors 11, and the thus oriented lights impinge on the microcapsule sheet 37 closely contacting the bottom of the exposure table 19A to form the latent image thereon. The two reflection mirrors 11 are securely mounted to a mirror mounting plate 12. The mirror mounting plate 12 is vertically movably connected to the main frame 41 of the apparatus 40, so that the adjustment of the length of the light path and focusing adjustment can be effected by fine adjustment of the position of the mirror mounting plate 12. The original (not shown), the filter 8, the lens 9, the pair of reflection mirrors 11 and the exposure table 19 define a U-shape or J-shape light path in combination.

The elongated web-like microcapsule sheet 37 is wound around a cartridge shaft 14 into a roll-type, and is retained in a microcapsule sheet cartridge 13 that is detachably disposed at a position immediately below an original support stand glass 2 and is formed with a bottom opening 13A. The exposure unit 19 is disposed below the sheet cartridge 13 at a downstream side thereof. The exposure unit 19 has an exposure stand 19A. An exposure zone of the exposure unit 19 is positioned quite adjacent to a developing zone of the pressure developing unit 20 as shown in FIG. 1. The sheet 37 passes through a number of rollers and the pressure developing unit 20, and a leading edge of the sheet 37 is attached to a take-up roll 25 positioned beside the sheet cartridge 13. A light shielding cover plate 16 is disposed between the cartridge 13 and the exposure unit 19 so as to maintain non-exposure state of the sheet 37 which is drawn from the opening 13A of the cartridge 13.

Between the sheet cartridge 13 and the exposure unit 19, a feed roller 15 and a barrel roller 17 are rotatably provided at a vertical sheet path for guide travel of the sheet toward the exposure unit 19. At the downstream side of the exposure unit 19, there is provided the pressure developing unit 20 which includes a small diameter roller 21 and a backup roller 31.

At downstream side of the pressure developing unit 20, a pair of feed rollers 22 are provided so as to provide constant running speed of the microcapsule sheet 37. This speed is coincident with a horizontally moving speed of the original support stand glass 2 so that linear latent images having given widths are sequentially formed on the microcapsule sheet 37 which is passing along the lower surface of the exposure table 19A. At downstream side of the feed rollers 22, there is provided a separation roller 23 by which the microcapsule sheet 37 is separated from the developer sheet 38. The separate microcapsule sheet 37 is taken-up by the above mentioned take up shaft 25 through a meander travel control roller 24.

At a lower portion of the apparatus 40, there is provided a developer sheet cassette 32 for storing therein a stack of developer sheets 38. Immediately above the cassette 32, a sector roller 33 is provided to feed each one of developer sheet 38 toward the pressure developing unit 20. Between the cassette 32 and the pressure developing unit 20, a roller 34 and a resist-gate 35 are provided so as to align leading edge of the developer sheet 38.

Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

The microcapsule sheet 37 and developer sheet 38 leaving the pressure developing unit 20 are fed out by the feed rollers 22 and are separated by the separation roller 23, the former sheet 37 directing upward and the latter sheet 38 directing the straight direction.

On the other hand, thermal fixing unit 30 is provided at the downstream side of the separation roller 23. The thermal fixing unit 30 includes a hollow heat roller 29 in which a heater 52 is disposed. Further a developer sheet feed roller 28 is provided to feed the image fixed developer sheet 38 toward a discharge tray 27. The developer sheet 38 is subjected to thermal fixing in the thermal fixing unit 30 and is then discharged onto the discharged tray 27 with its image surface up.

Operation of the copying apparatus will be described:

First, the original support stand cover 1 is lifted up for mounting the original on the original support stand glass 2. Then, when a start button (not shown) is depressed, the original support stand glass 2 is moved to one direction (rightwardly in FIG. 1), so that one side edge of the glass 2 (left side edge in FIG. 1) stops at a first position where the one side edge of the glass 2 is coming into confrontation with the light source. Thereafter, with the halogen lamp 3 being lighted, the original support stand glass 2 is then moved leftwardly in FIG. 1. The light emitted from the halogen lamp 3 is reflected at the original, and the reflected light passes through the filter 8 and lens 9 and is reflected at two reflection mirrors 11. The last reflected light is finally directed toward the microcapsule sheet 37 which is located under the exposure table 19 to form the latent image on the sheet 37. At this time, since the microcapsule sheet 37 is moved under the exposure table 19 leftwardly in FIG. 1 at the same speed as the moving speed of the original support stand glass 2, the latent image corresponding to the original image is formed on the microcapsule sheet 37. Since the conveying speed for the microcapsule sheet 37 is controlled to be constant by feed rollers 22 and is set equal to the moving speed of the original support stand glass 2, linear latent images having given widths are sequentially formed on the microcapsule sheet 37 that is passing along the lower surface of the exposure table 19A.

The sheet 37 is then fed to the pressure developing unit 20 by the guide roller 17. At this time, the developer sheets 38 are fed out one by one by the sector or woodruff roller 33, and each sheet 38 is fed to a sheet inlet of the pressure developing unit 20 after leading edge of the sheet 38 is aligned by developer sheet rollers 34 and the resist gate 35. At the pressure developing unit, the sheet 37 is pressurizingly superposed with the developer sheet 38.

Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction. Thereafter, the developer sheet 38 is subjected to thermal fixing in the thermal fixing unit 30 and is then discharged onto the discharge tray 27 with its image surface up. In the thermal fixing unit 30, coloring of the developer sheet 38 is accelerated and glossy color image is obtained by melting resin on the developer sheet 38.

Meanwhile, the microcapsule sheet 37 leaving the pressure developing unit 20 and passing through the separation roller 23 and the meandering control roller 24 is wound around the take-up roll 25. When the movement of the original support stand glass 2 is stopped at a second position where another edge (right side in FIG. 1) of the glass 2 confronts the light source, the copying of the original is completed and the halogen lamp 3 is turned off.

Next, a control device of the copying machine will be described below with reference to FIGS. 2 and 3.

Figure 2:
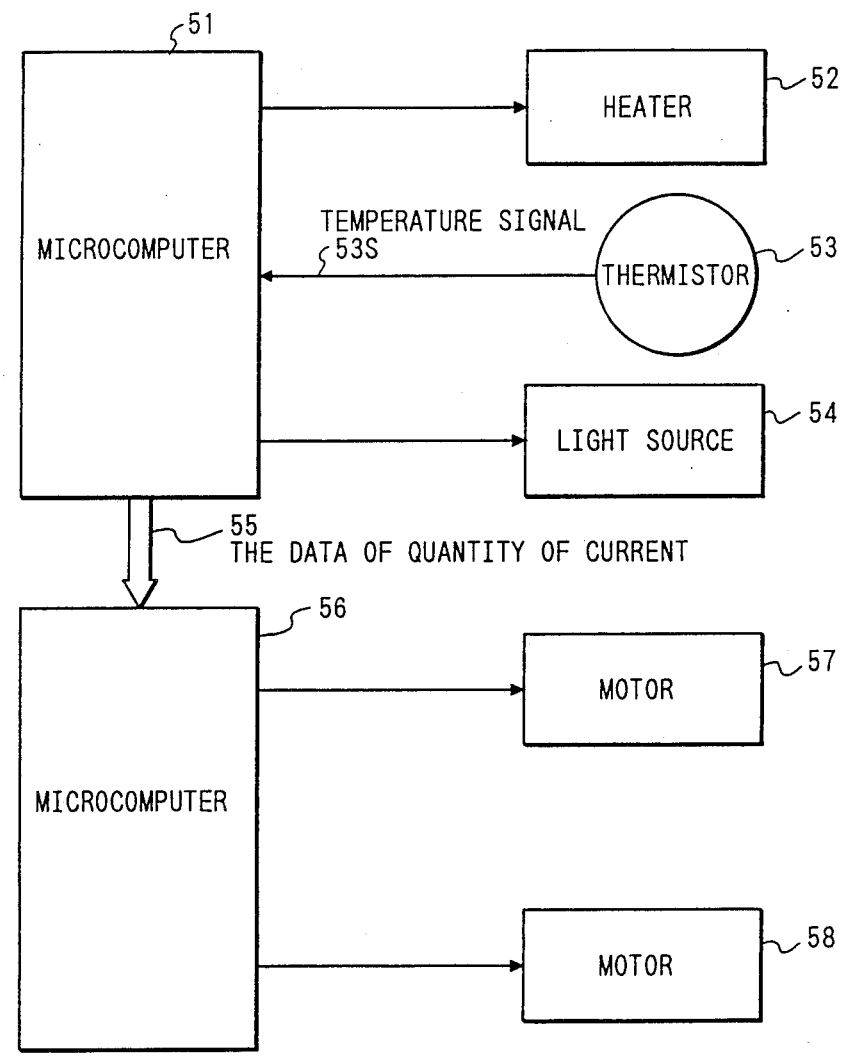
FIG. 2 is a block diagram for description of a inventive concept of the present invention; and, FIG. 3 is a flowchart showing processing sequences of a microcomputer incorporated in the apparatus according to the present invention.
Figure 3:
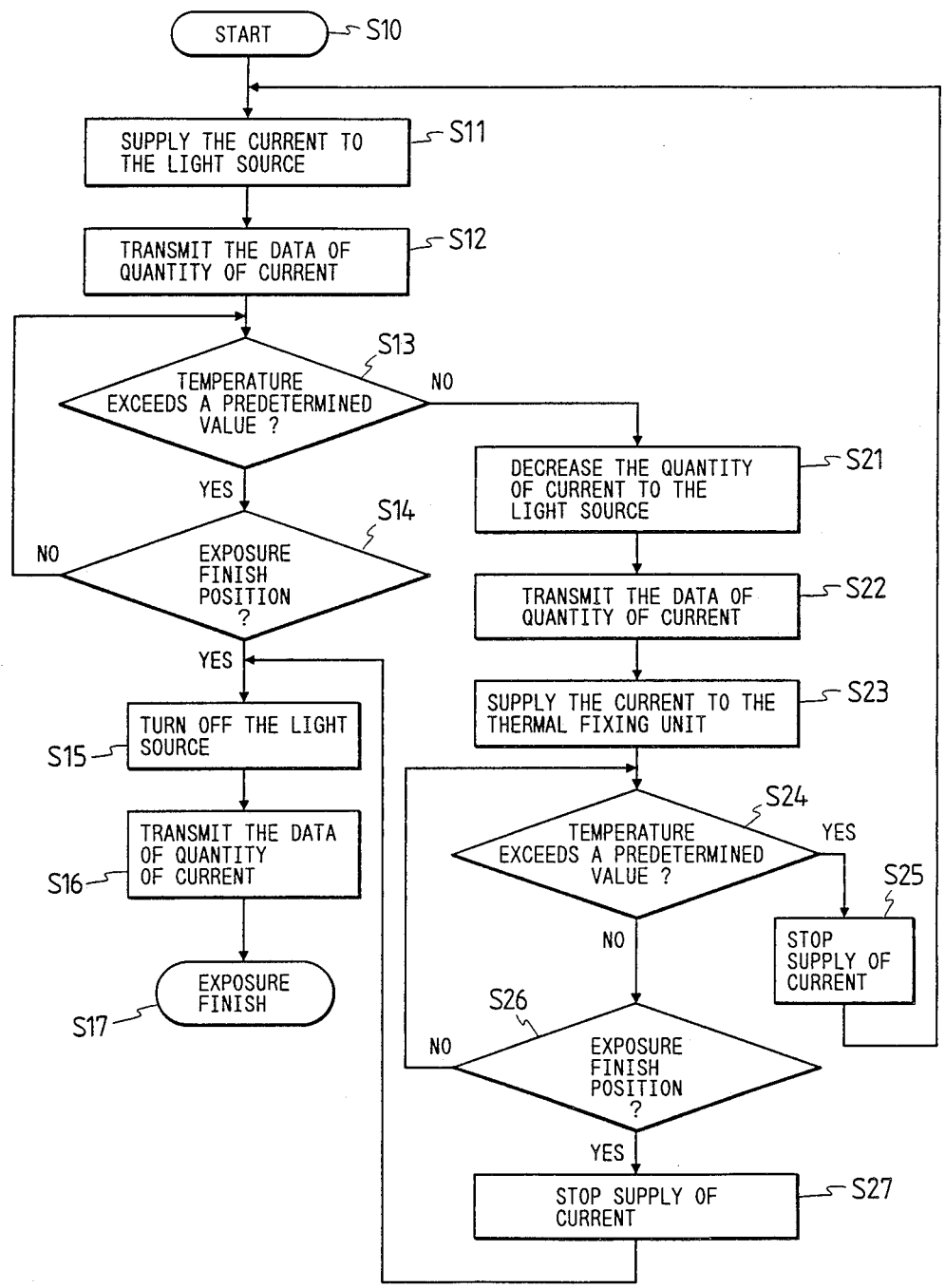

In FIG. 2, reference numeral 51 designates a microcomputer comprising means for controlling a quantity of current from power supply 50. A thermistor 53, a heater 52 and a light source 54 are connected to the microcomputer 51, the quantity of current to be supplied to the heater 52 is controlled in accordance with a temperature signal 53S from the thermistor 53 by the microcomputer 51. The microcomputer 51 controls the quantity of current from power supply 60 to be supplied to the light source 54 so that total consumed current (the sum of quantity of current to be supplied to the heater 52 and quantity of current to be supplied to the light source 54) does not exceed a predetermined quantity, for example, 15 amperes.

The microcomputer 51 is connected to another microcomputer 56 for controlling exposure speed (running speed of the microcapsule sheet 37 at exposure zone), the data 55 of the quantity of current from power supply 50 to be supplied to the light source 54 are transmitted from the microcomputer 51 to the microcomputer 56. The microcomputer 56 is connected to a motor 57 for moving the original stand glass 2 and a motor 58 for moving the microcapsule sheet 37 and the developer sheet 38.

The microcomputer 56 controls the rotational speed of the motor 57 and the rotational speed of the motor 58 while keeping the speed ratio between two motors 56, 57 constant so as to computer the quantity of light of the light source 54 and correct variation of the quantity of light of the light source 54. When the quantity of current from power supply 50 to be supplied to the light source 54 is decreased and the quantity of light of the light source 54 is decreased, the microcomputer 56 controls the motors 57 and 58 so as to reduce their rotational speed, to thereby prevent degradation of imaging quality due to shortage of the quantity of light.

Next, the processing sequences executed by the microcomputer 51 will be described with reference to a flowchart shown in FIG. 3.

While the light source 54 is not lit, the total consumed current from power supply 50 does not exceed a predetermined quantity even if a maximum current is supplied to the heater 52 in the thermal fixing unit 30. Therefore, the processing sequences during period when the light source 54 is lit will only be described in detail.

In step 10, when the start signal of exposure is inputted into the, microcomputer 51 from start switch (not shown), a current from power supply 50 supplied to the light source 54 in step 11. At this time, the data 55 of the quantity of current to be supplied to the light source 54 is transmitted to the microcomputer 56 in step 12. In step 13, a judgment is made as to whether or not temperature of the heater 52 in the thermal fixing unit 30 exceeds a predetermined temperature. If the result of the judgment is "YES", the processing advances to step 14 where it is judged whether her or not the microcapsule sheet 37 is fed by a predetermined amount and is positioned at exposure finish position without supplying the current to the heater 52. If the result of the judgment is "NO" in step 14, the processing returns to step 13. If the result of the judgment is "YES" in step 14, the processing advances to step 15 where the light source 54 is turned off, this fact is transmitted to the microcomputers 56 in step 16. Thereafter, the exposure is finished in step 17.

On the other hand, in step 13 if the temperature of the heater 52 does not exceed a predetermined temperature, the processing advances to step 21 where the quantity of current to be supplied to the light source 54 is decreased, this fact is transmitted to the microcomputer 56 in step 22. Then, the current, from power supply 50 is supplied to the heater 52 in the thermal fixing unit 30 in step 23. In step 24, a judgment is made as to whether or not the temperature of the heater 52 in the thermal fixing unit 30 exceeds a predetermined temperature in the same manner as in step 13. If the result of the judgment is "YES", the processing advances to step 25 where supplying the current to the heater 52 is stopped, and the processing returns to step 11 where the quantity of current to be supplied to the light source 54 is returned to its original condition. If the result of the judgment is "NO" in step 24, the processing advances to step 26 where it is judged whether or not the exposing unit 19 is positioned at exposure finish position. If the result of the judgment is "NO" in step 26, the processing returns to step 24. If the result of the judgment is "YES" in step 26, the processing advances to step 27 where supplying the current to the heater 52 is stopped, and the processing returns to step 15.

The microcomputer 56 controls the motor 57 for exposure and the motor 58 for feeding, the microcapsule sheet in accordance with the data 55 from microcomputer 51 of the quantity of current from power supply 50 to be supplied to the light source 54. When the data 55 of the quantity of current to be supplied to the light source 54 is decreased and the quantity of light of the light source 54 is decreased, the microcomputer 56 controls the motors 57 and 58 so as to reduce their rotational speed. On the contrary, when the data 55 of the quantity of current to be supplied to the light source 54 is increased, the motors 57 and 58 increase their rotational speed.

The foregoing embodiment concerns the image recording apparatus in which the original is moved, however, the present invention is also available for other type of the image recording apparatus in which the original is fixed, and other components such as a mirror and a lamp are moved.

As will be apparent from the aforementioned description, according to the present invention, even if the light source which consumes a large amount of electric power is employed, since the quantity of current to be supplied to the light source is controlled in accordance with the quantity of current to be supplied to the thermal fixing unit, the total consumed current from power supply 50 is limited to a small value which does not exceed, for example, 15 amperes. Therefore, a household plug socket can be used in this apparatus. Further, since exposure speed is decreased when the quantity of current to be supplied to the light source is decreased, the quantity of exposure light of the photosensitive recording medium is not changed, to thereby prevent degradation of imaging quality.

While the invention has been described with reference to specific embodiment thereof, it would be apparent for those skilled in the art that various changes and modifications can be made therein without departing from the spirit and scope of the invention.

What is claimed is:

1. An image recording apparatus for recording an image corresponding to an original on a recording medium, said recording medium including a photosensitive recording medium and an image forming sheet, said apparatus comprising;

a light source for irradiating a light on said original;

optical means for directing the reflected light reflected from said original or the transmitted light passing through said original to said photosensitive recording medium;

scanning means for moving said light source and optical means, and said original relatively to each other during exposure;

moving means for moving said photosensitive recording medium during exposure;

transferring means for transferring an image on said photosensitive recording medium to said image forming sheet;

thermal fixing means for fixing said transferred image on said image forming sheet;

temperature detecting means for detecting temperature of said thermal fixing means;

first control means for controlling the quantity of current to be supplied to said light source in accordance with the quantity of current to be supplied to said thermal fixing means; and, second control means for controlling speeds of said scanning means and said moving means in accordance with the quantity of light of said light source controlled by said first control means.

2. An image recording apparatus as defined in claim 1, wherein said temperature detecting means comprises thermistor.

3. An image recording apparatus as defined in claim 1, wherein said first control means controls the quantity of current to be supplied to said light source so that the total consumed current which is the sum of the quantity of currents supplied to the said thermal fixing means and said light source does not exceed a predetermined value.

4. An image recording apparatus as defined in claim 1, wherein said second control means controls speeds of said scanning means and said moving means so that said speeds are decreased when the quantity of current supplied to said light source is decreased.

5. An image recording apparatus as defined in claim 1, wherein said first and second control means control the quantity of current to be supplied to said light source and speeds of said scanning means and said moving means so that the quantity of exposure light of said photosensitive recording medium is kept constant.

* * * * *